US006777784B1

(12) United States Patent
Vashchenko et al.

(10) Patent No.: US 6,777,784 B1
(45) Date of Patent: Aug. 17, 2004

(54) BIPOLAR TRANSISTOR-BASED ELECTROSTATIC DISCHARGE (ESD) PROTECTION STRUCTURE WITH A HEAT SINK

(75) Inventors: Vladislav Vashchenko, Fremont, CA (US); Peter J. Hopper, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 12 days.

(21) Appl. No.: 09/690,580

(22) Filed: Oct. 17, 2000

(51) Int. Cl.[7] ................ H01L 27/082; H01L 27/102; H01L 29/70; H01L 31/11

(52) U.S. Cl. .................................. 257/587; 257/362
(58) Field of Search ........................ 257/552, 554, 257/556, 273, 350, 370, 355, 356, 357, 358, 359, 360, 197, 198

(56) References Cited

U.S. PATENT DOCUMENTS

| | | | | |
|---|---|---|---|---|
| 4,724,471 A | * | 2/1988 | Leuschner | 357/23.13 |
| 5,175,613 A | * | 12/1992 | Barker | 257/713 |
| 5,181,092 A | * | 1/1993 | Atsumi | 257/361 |
| 5,216,279 A | * | 6/1993 | Nakao | 257/712 |
| 5,276,582 A | * | 1/1994 | Merrill et al. | 361/111 |
| 5,500,546 A | * | 3/1996 | Marum et al. | 257/358 |
| 5,581,104 A | * | 12/1996 | Lowrey et al. | 257/355 |
| 5,587,326 A | * | 12/1996 | Takemura | 437/31 |
| 5,907,174 A | * | 5/1999 | Lee et al. | 257/357 |

(List continued on next page.)

FOREIGN PATENT DOCUMENTS

| | | | | |
|---|---|---|---|---|
| JP | 359046055 A | * | 3/1984 | |
| JP | 406232351 A | * | 8/1994 | |

OTHER PUBLICATIONS

G.Meneghesso, J.R.M. Luchies, F.G. Kuper and A.J. Mouthaan, Turn–On Speed of Grounded Gate NMOS ESD Protection Transistors 1996, pp. 1735–1738.*

(List continued on next page.)

Primary Examiner—Long Pham
Assistant Examiner—Dana Farahani
(74) Attorney, Agent, or Firm—Mark C. Pickering

(57) ABSTRACT

An ESD protection structure for use with bipolar or BiC-MOS ICs that is relatively immune to thermal overheating and, thus, stable during an ESD event. This immunity is achieved by employing a heat sink region adjacent to a polysilicon emitter within a distance of less than 2 microns. Such a heat sink region provides temporal heat capacity to locally dissipate the heat generated during an ESD event. Bipolar transistor-based ESD protection structures according to the present invention include a semiconductor substrate and a bipolar transistor in and on the semiconductor. The bipolar transistor includes a base region, a collection region and a polysilicon emitter. The bipolar transistor-based ESD protection structures also include a heat sink region disposed above the semiconductor substrate adjacent to the polysilicon emitter. The heat sink region is formed of a material with a heat capacity and/or thermal conductivity that is greater than the heat capacity and/or thermal conductivity of the material (typically an $SiO_2$-based material) which conventionally covers the ESD protection structures. The heat sink region can be formed, for example, of metal and/or polysilicon. In one embodiment, the heat sink region is floating and disposed adjacent to the polysilicon. In another embodiment, the heat sink region is integrated with a metal contact to the polysilicon emitter, thereby making the otherwise conventional metal contact bulkier. By locally providing extra heat capacity (i.e., a floating heat sink region or a bulky metal contact), heat is dissipated during an ESD event, thereby increasing ESD protection capability and reliability.

18 Claims, 3 Drawing Sheets

U.S. PATENT DOCUMENTS

| | | | | |
|---|---|---|---|---|
| 6,013,941 | A | * | 1/2000 | Shimizu .................. 257/565 |
| 6,031,255 | A | * | 2/2000 | Delage et al. ............. 257/198 |
| 6,075,288 | A | * | 6/2000 | Akram .................... 257/706 |
| 6,114,768 | A | * | 9/2000 | Gaul et al. ................ 257/777 |
| 6,121,661 | A | * | 9/2000 | Assaderaghi et al. ....... 257/355 |
| 6,172,404 | B1 | * | 1/2001 | Chen et al. ............... 257/361 |
| 6,222,237 | B1 | * | 4/2001 | Lin ........................ 257/358 |
| 6,376,866 | B1 | * | 4/2002 | Shakuda .................. 257/103 |
| 6,534,372 | B1 | * | 3/2003 | Racanelli ................. 438/321 |

OTHER PUBLICATIONS

Minh Tong, Robert Gauthier and Vaughn Gross, Study of Gated PNP As an ESD Protection Device for Mixed–Voltage and Hot–Pluggable Circuit Applications, IBM Microelectronics Division, pp 6.3.1–6.3.5.*

G. Croft et al., *ESD Protection Techniques for High Frequency Integrated Circuits*, Microelectronics Reliability 38, 1998, pp. 1681–1689.

J. Z. Chen et al., *Design and Layout of a High ESD Performance NPN Structure for Submicron BiCMOS–Bipolar Circuits*, 34th Annual IEEE International Reliability Physics Symposium Proceedings, 1996, pp. 227–232.

J.C. Bernier et al., *A Process Independent ESD Design Methodology*, IEEE International Symposium on Circuits and Systems Proceedings 1, 1999, pp. 218–221.

W.D. Mack et al., *New ESD Protection Schemes for BiCMOS Processes with Application to Cellular Radio Designs*, IEEE International Symposium on Circuits and Systems 6, 1992, pp. 2699–2702.

* cited by examiner

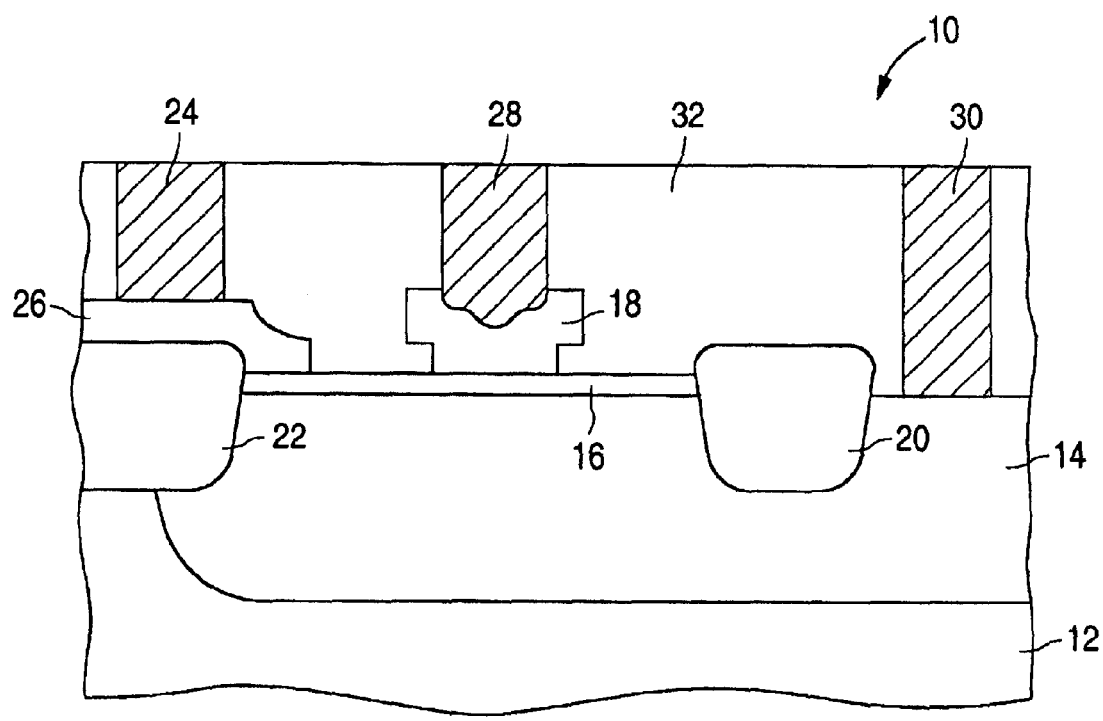
FIG. 1
(PRIOR ART)
FIG. 2A
(PRIOR ART)
FIG. 2B
(PRIOR ART)

US 6,777,784 B1

BIPOLAR TRANSISTOR-BASED ELECTROSTATIC DISCHARGE (ESD) PROTECTION STRUCTURE WITH A HEAT SINK

BACKGROUND OF THE INVENTION

1. Field of the Invention

The present invention relates to semiconductor device structures and, in particular, to electrostatic discharge protection structures for use with integrated circuits.

2. Description of the Related Art

Electrostatic Discharge (ESD) protection devices are commonly employed in an integrated circuit (IC) to protect electronic devices in the IC from spurious pulses of excessive voltage (e.g., an ESD event, Human Body Model [HBM] event, or Electrical Overstress [EOS] event). See, for example, S. M. Sze, *Electrostatic Discharge Damage*, in VLSI Technology, Second Edition, 648–650 (McGraw Hill, 1988). A variety of conventional ESD protection devices that make extensive use of diodes, metal-oxide-semiconductor field effect transistors (MOSFETS) and bipolar transistors are known in the field.

Conventional bipolar transistor-based ESD protection devices include, for example, bipolar transistor-based transient and bipolar transistor-based static ESD protection devices (e.g., grounded base bipolar transistor-based ESD protection devices and Zener Triggered bipolar transistor-based ESD protection devices). Descriptions of these and other conventional ESD protection structures are available in G. Croft and J. Bernier, *ESD Protection Techniques for High Frequency Integrated Circuits*, Microelectronics Reliability 38, 1681–1689 (1998); *Design and Layout of a High ESD Performance NPN Structure for Submicron BiCMOS/Bipolar Circuits*, J. Z. Chen et al., *Design and Layout of a High ESD Performance NPN Structure for Submicron BiCMOS/Bipolar Circuits*, 34$^{th}$ Annual IEEE International Reliability Physics Symposium Proceedings, 227–232 (1996); J. C. Bernier et al., *A Process Independent ESD Design Methodology*, IEEE International Symposium on Circuits and Systems Proceedings 1, 218–221 (1999); W. D. Mack et al., *New ESD Protection Schemes for BiCMOS Processes with Application to Cellular Radio Designs*, IEEE International Symposium on Circuits and Systems 6, 2699–2702 (1992), each of which is hereby fully incorporated by reference.

FIG. 1 is a cross-sectional view of a conventional bipolar transistor-based ESD protection structure 10. Conventional bipolar transistor-based ESD protection structure 10 includes a P-type substrate 12, an N-type collector region 14, a P-type base region 16 (e.g., a P-type Si—Ge base region) and an N-type polysilicon emitter 18. The conventional bipolar transistor-based ESD protection structure 10 also includes electrical isolation regions 20 and 22. A metal base contact 24 makes contact with the P-type base region 16 via polysilicon line 26. A metal emitter contact 28 is in contact with the N-type polysilicon emitter 18, while a metal collector contact 30 is in contact with the N-type collector region 14. The metal base contact 24, the metal emitter contact 28 and the metal collector contact 30 each extends through dielectric layer 32.

Electrical schematics illustrating this conventional bipolar transistor-based ESD protection structure 10 arranged in a grounded base bipolar transistor-based ESD protection device and a Zener Triggered bipolar transistor-based ESD protection device are provided in FIGS. 2A and 2B, respectively.

A significant physical limitation of conventional bipolar transistor-based ESD protection structures is their susceptibility to thermal overheating and associated irreversible damage (e.g., local melting). As a consequence, conventional bipolar transistor-based ESD protection structures are unstable in the event that a critical temperature of approximately 1300° K is reached during an ESD event. Still needed in the field, therefore, is an ESD protection structure for use with bipolar or BiCMOS ICs that is relatively immune to thermal overheating and, thus, stable during an ESD event.

BRIEF DESCRIPTION OF THE DRAWINGS

A better understanding of the features and advantages of the present invention will be obtained by reference to the following detailed description that sets forth illustrative embodiments, in which the principles of the invention are utilized, and the accompanying drawings (in which like numerals are used to designate like elements), of which:

FIG. 1 is a cross-sectional view of a conventional bipolar transistor-based ESD protection structure.

FIGS. 2A and 2B are electrical schematics illustrating a conventional grounded base NPN bipolar transistor-based ESD protection device and Zener Triggered NPN bipolar transistor-based ESD protection device, respectively.

DETAILED DESCRIPTION OF THE INVENTION

To be consistent throughout the present specification and for clear understanding of the present invention, the following definitions are provided for terms used therein:

The terms "dopant" and "dopants" refer to donor and acceptor impurity atoms (e.g., boron [B], phosphorous [P], arsenic [As] and indium [In]), which are intentionally introduced into a semiconductor substrate (e.g., a silicon wafer) in order to change the substrate's charge-carrier concentration. See, R. S. Muller and T. I. Kamins, *Device Electronics for Integrated Circuits 2nd Edition*, 11–14 (John Wiley and Sons, 1986) for a further description of dopants.

The term "floating," when used in reference to a heat sink, refers to the absence of a direct electrical connection (i.e., a contact) to the heat sink.

Figure 3:
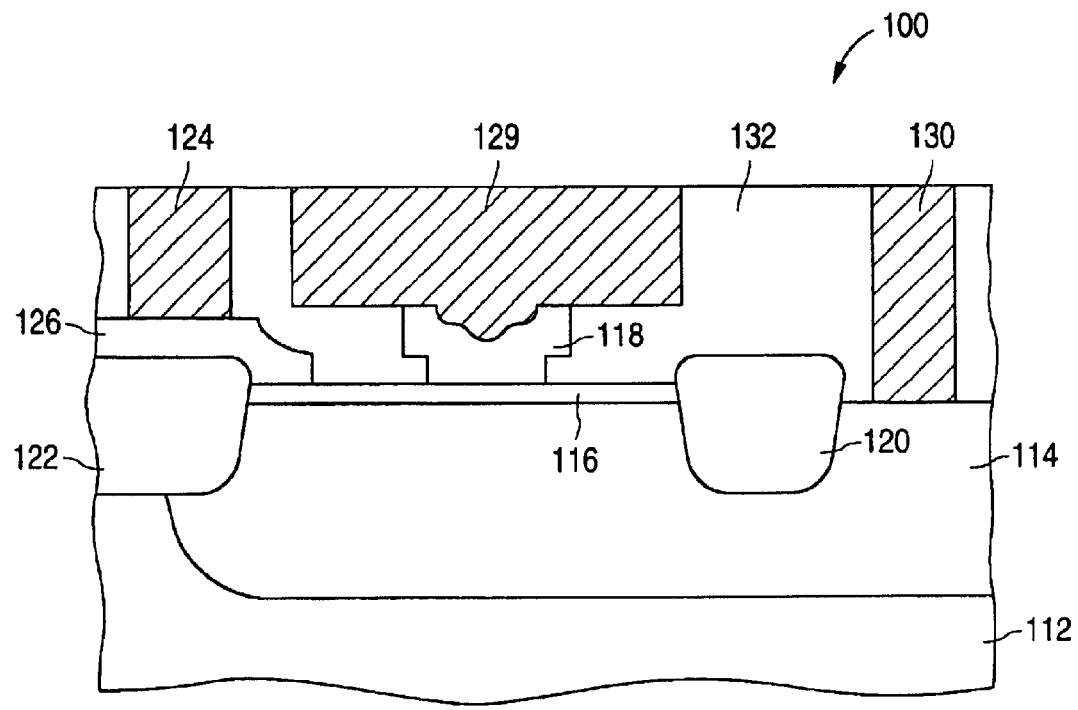
FIG. 3 is a cross-sectional view of a bipolar transistor-based ESD protection structure according to the present invention with a heat sink region.

FIG. 3 illustrates one embodiment of a bipolar transistor-based ESD protection structure 100 for use with bipolar or BICMOS ICs according to the present invention. The bipolar transistor-based ESD protection structure 100 includes a P-type semiconductor substrate 112, a bipolar transistor disposed in and on the semiconductor substrate and electrical isolation regions 120 and 122 disposed in and on the semiconductor substrate electrically separating one bipolar transistor from another. The dopant level in the semiconductor substrate can be any conventional level known in the art. The bipolar transistor includes an N-type collector region 114, a P-type base region 116 (e.g., a P-type Si—Ge base region) and an N-type polysilicon emitter 118. A metal base contact 124 makes contact with the P-type base region 116 via polysilicon line 126, while a metal collector contact 130 is in contact with the N-type collector region 114. The bipolar transistor-based ESD protection structure 100 also includes a heat sink region 129 integrated with a conventional metal emitter contact to the N-type polysilicon emitter 118, thereby making the otherwise conventional metal emitter contact bulkier (i.e., possessing an increased heat capacity).

In bipolar transistor-based ESD protection structures for use with 5–7 GHz BiCMOS technology, a considerable improvement of protection capability has been realized by the implementation of a bulky metal emitter contact. When disposed adjacent to the polysilicon emitter within a distance of less than 2 microns from the point of maximum generated temperature during a transitory (e.g., 150 nano-second) ESD event, such a bulky metal emitter contact acts as a temporal local heat sink during the ESD event. Due to its extra heat capacity, heat is dissipated in the bulky metal emitter contact (i.e., heat sink region), thereby increasing the ESD protection capability by 30–50%. The increased ESD protection capability enables more reliable protection for relatively higher HBM pulse amplitude or the use of a smaller bipolar transistor-based ESD protection structure.

Figure 4:
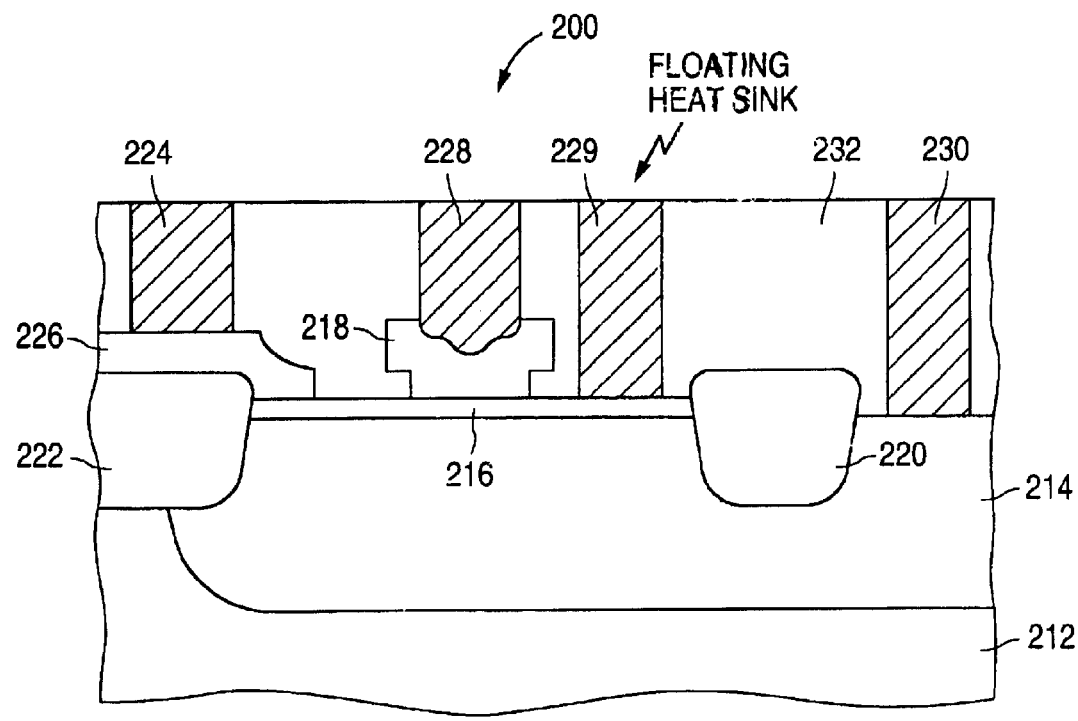
FIG. 4 is a cross-sectional view of another bipolar transistor-based ESD protection device according to the present invention with a floating heat sink region.

FIG. 4 illustrates another embodiment of a bipolar transistor-based ESD protection structure 200 for use with bipolar or BiCMOS ICs according to the present invention. The bipolar transistor-based ESD protection structure 200 includes a P-type semiconductor substrate 212, a bipolar transistor disposed in and on the semiconductor substrate and electrical isolation regions 220 and 222 disposed in and on the semiconductor substrate electrically separating one bipolar transistor from another. The bipolar transistor includes an N-type collector region 214, a P-type base region 216 (e.g., a P-type Si—Ge base region) and an N-type polysilicon emitter 218. A metal base contact 224 makes contact with the P-type base region 216 via polysilicon line 226, while a metal collector contact 230 and a metal emitter contact 228 are in contact with the N-type collector region 214 and the N-type polysilicon emitter, respectively. The bipolar transistor-based ESD protection structure 200 also includes a floating heat sink region 229 above the semiconductor substrate 212 adjacent to the N-type polysilicon emitter within a distance of less than 2 microns, preferably less than 1.5 microns. This location accumulates heat during an ESD event. A floating heat sink region disposed adjacent to a polysilicon emitter, where heat is known to accumulate during an ESD event, provides temporal local heat capacity and dissipates heat during the ESD event. By providing such extra heat capacity to the otherwise conventional bipolar transistor-based ESD protections structure, ESD protection capability and reliability are significantly increased.

Figure 5:
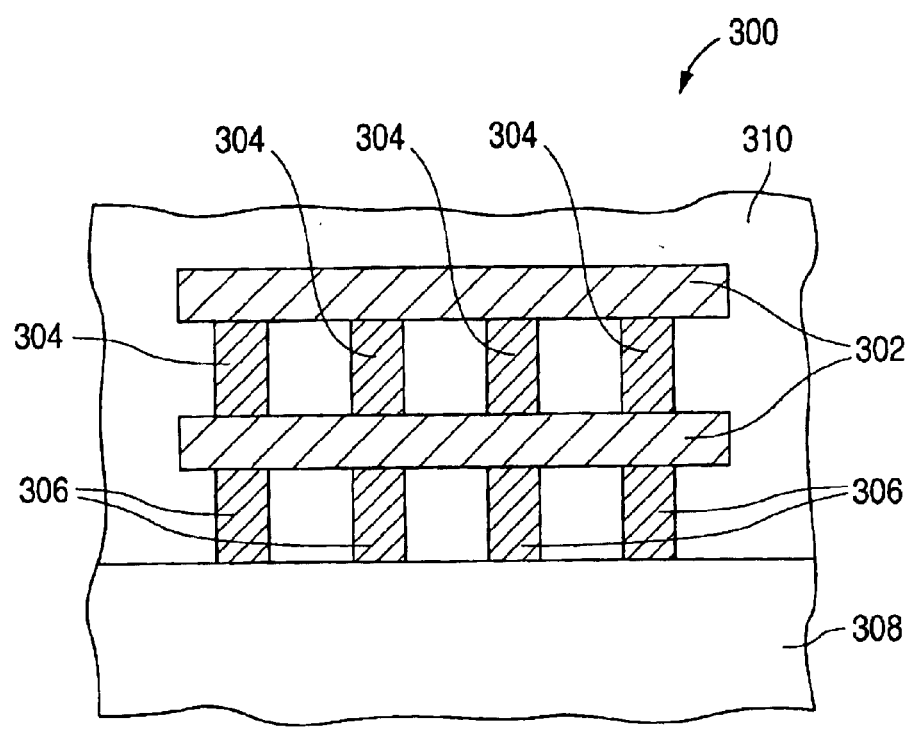
FIG. 5 is a cross-sectional view of a heat sink for use in a bipolar transistor-based ESD protection structure according to the present invention.

The heat sink regions of FIGS. 3 and 4 have an essentially rectangular cross-sectional shape. Other heat sink shapes can, however, provide the required heat dissipation capability, regardless of whether the heat sink is floating or integrated with a metal emitter contact. A heat sink can, for example, be formed of a plurality of interconnected metal layers and a bulky polysilicon emitter contact. FIG. 5 illustrates a heat sink region 300 manufactured as interconnected 0.35 micron thick metal layers 302, 0.25 micron wide via-like structures 304, 0.35 micron wide contact-like structures 306 and bulky polysilicon emitter contact 308. The heat sink region 300 is surrounded by a conventional dielectric material layer 310. This arrangement provides for a heat sink to be easily manufactured using conventional polysilicon and metal layer deposition and via formation techniques.

Figure 6:
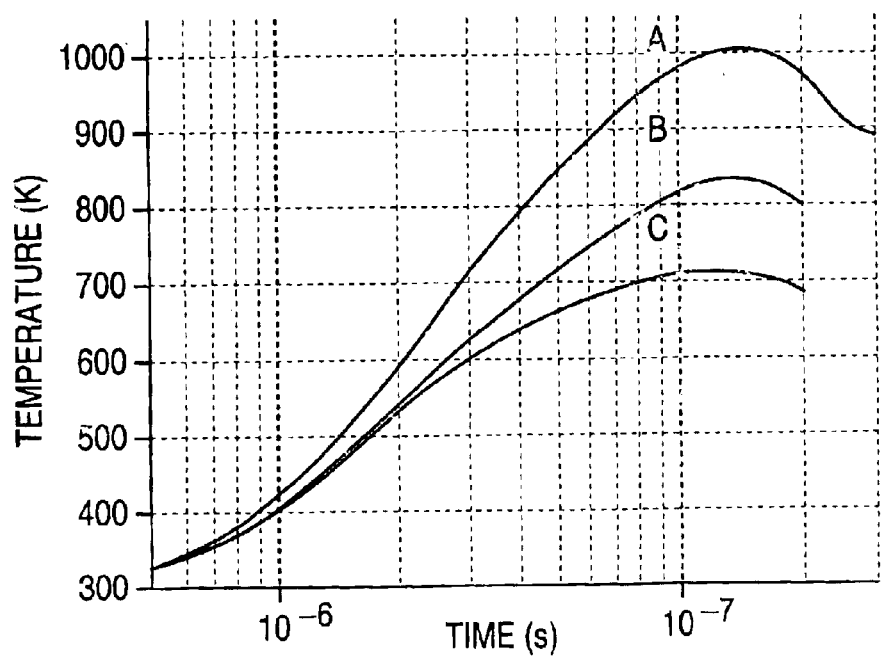
FIG. 6 is a graph of temperature versus time from a numerical simulation that illustrates the thermal behavior, during a 2 kV HBM pulse, of various Si—Ge 50 micron bipolar transistor-based ESD protection structures: a bipolar transistor-based ESD protection structure without a metal contact (curve A), a conventional bipolar transistor-based ESD protection structure with a regular metal emitter contact to a polysilicon emitter (curve B) and a bipolar transistor-based ESD protection structure according to the present invention with a heat sink region that is integrated with a metal emitter contact to a polysilicon emitter (curve C).

Increased ESD protection capability and reliability of bipolar transistor-based ESD protection structures according to the present invention are apparent from FIG. 6. FIG. 6 comparatively illustrates the thermal behavior, during a 2 kV HBM pulse, of various Si—Ge 50 micron bipolar transistor-based ESD protection structures: a bipolar transistor-based ESD protection structure without a metal emitter contact (curve A), with a conventional metal emitter contact (curve B) and with a "bulky" metal emitter contact (curve C).

FIG. 6 suggests that a bipolar transistor-based ESD protection device without a metal contact would attain a maximum generated temperature of approximately 1000° K, while a bipolar transistor-based ESD protection device with a conventional metal emitter contact would reach a maximum generated temperature of 830° K. However, a bipolar transistor-based ESD protection device with a bulky metal emitter contact according to the present invention (i.e., with a heat sink) would attain a maximum generated temperature of only 710° K.

The maximum temperature generated in the bipolar transistor-based ESD protection structure according to the present invention is approximately 15% lower than in the bipolar transistor-based ESD protection structure with a conventional metal emitter contact. A corresponding or greater improvement in ESD protection capability for bipolar transistor-based ESD protection structures according to the present invention is expected. Bipolar transistor-based ESD protection structures according to the present invention can, therefore, provide reliable ESD protection for ESD events of higher amplitude than conventional structures or provide equivalent ESD protection with a smaller structure.

Bipolar transistor-based ESD protection structures according to the present invention can be configured in any known configuration, including grounded base and Zener triggered configurations.

One skilled in the art will recognize that the ESD protection capability and reliability of the bipolar transistor-based ESD protection devices is provided in an analogous manner to that described in U.S. patent application for "MOSFET-Based Electrostatic Discharge (ESD) Protection Structure With a Floating Heat Sink" by the same inventors (filed Oct. 6, 2000; application number not yet assigned), which is hereby fully incorporated by reference, with respect to MOSFET-based ESD protection devices.

It should be understood that various alternatives to the embodiments of the invention described herein may be employed in practicing the invention. It is intended that the following claims define the scope of the invention and that structures within the scope of these claims and their equivalents be covered thereby.

What is claimed is:

1. An electrostatic discharge device formed in a first semiconductor material, the device comprising:
   a collector region of a first conductivity type formed in the first semiconductor material;

a base region of a second conductivity type formed in the collector region;

an emitter formed on the first semiconductor material on the base region, the emitter having a top surface and a width;

a base extender formed on the first semiconductor material on the base region, the base extender being formed from a second semiconductor material that is different from the first semiconductor material;

a layer of dielectric material formed on the first semiconductor material on the base region;

an ohmic emitter contact formed through the dielectric layer, the emitter contact having a top surface, contacting the top surface of the emitter, and having a width that is greater than the width of the emitter; and an ohmic base contact formed through the layer of dielectric material, the base contact having a top surface, contacting the top surface of the base extender, being electrically connected to the base region, and having a width that is less than the width of the emitter contact, the ohmic base contact being formed from a third semiconductor material different from the second semiconductor material.

2. The device of claim 1 wherein the top surface of the base contact lies in substantially the same plane as the top surface of the emitter contact.

3. The device of claim 1 wherein the base region has a first conductivity type, the emitter has a second conductivity type, and the base extender has the first conductivity type.

4. The device of claim 1 wherein the emitter and the base extender are polysilicon.

5. An electrostatic discharge device formed in a semiconductor material, the device comprising:

a collector region formed in the semiconductor material;

a base region formed in the collector region;

an emitter formed on the semiconductor material on the base region;

a base extender formed on the semiconductor material on the base region;

a layer of dielectric material formed on the substrate material on the base region;

an emitter contact formed through the dielectric layer, the emitter contact having a top surface and contacting the top surface of the emitter;

a base contact formed through the layer of dielectric material, the base contact having a top surface and contacting the top surface of the base extender; and a heat sink contact formed through the layer of dielectric material, the heat sink contact having a top surface and contacting the top surface of the base.

6. The device of claim 5 wherein the top surface of the base contact lies in substantially the same plane as the top surface of the emitter contact and the top surface of the heat sink contact.

7. The device of claim 5 wherein the base region has a first conductivity type, the emitter has a second conductivity type, and the base extender has the first conductivity type.

8. The device of claim 5 wherein the emitter and the base extender are polysilicon.

9. The device of claim 5 wherein the heat sink contact has a single electrical connection, the single electrical connection being to the base region.

10. The device of claim 5 wherein the heat sink contact includes a plurality of metal layers.

11. The device of claim 5 wherein the layer of dielectric material has a thermal conductivity; and the heat sink contact has a thermal conductivity that is substantially greater than the thermal conductivity of the layer of dielectric material.

12. The device of claim 1 and further comprising a first trace formed on the layer of dielectric material and the emitter contact.

13. The device of claim 12 and further comprising:

a second layer of dielectric material formed on the first layer of dielectric material and the first trace;

a via formed through the second layer of dielectric material to make an electrical contact with the first trace; and a second trace formed on the second layer of dielectric material to make an electrical contact with the via.

14. An electrostatic discharge device formed in a semiconductor material, the device comprising:

a collector of a first conductivity type formed in the semiconductor material;

a base of a second conductivity type connected to the collector;

an emitter of the first conductivity type connected to the base;

a layer of dielectric material formed over the base;

an emitter contact connected to the layer of dielectric material and the emitter; the emitter contact having a top surface;

a base connector connected to the layer of dielectric material and the base, the base connector having a top surface; and a heat sink contact connected to the layer of dielectric material and the base, the heat sink contact being spaced apart and electrically isolated from the base connector, having a top surface, and contacting the top surface of the base.

15. The device of claim 14 wherein the base connector includes:

a base extender connected to an isolation region and the base region; and a vertical base contact connected to the base extender and the layer of dielectric material.

16. The device of claim 14 wherein the top surface of the emitter contact, the top surface of the base connector, and the top surface of the heat sink contact lie substantially in a same plane.

17. The device of claim 14 wherein:

the layer of dielectric material has a thermal conductivity; and the heat sink contact has a thermal conductivity that is substantially greater than the thermal conductivity of the layer of dielectric material.

18. The device of claim 14 wherein the heat sink contact has a single electrical connection, the single electrical connection being to the base.

* * * * *

UNITED STATES PATENT AND TRADEMARK OFFICE
CERTIFICATE OF CORRECTION

PATENT NO. : 6,777,784 B1
DATED : August 17, 2004
INVENTOR(S) : Vashchenko et al.

It is certified that error appears in the above-identified patent and that said Letters Patent is hereby corrected as shown below:

Column 1,
Line 38, delete "Bemier" and replace with -- Bernier --.

Column 2,
Line 67, delete "BICMOS" and replace with -- BiCMOS --.

Signed and Sealed this

First Day of February, 2005

JON W. DUDAS
*Director of the United States Patent and Trademark Office*